US009431999B1

(12) United States Patent
Tsironis

(10) Patent No.: US 9,431,999 B1
(45) Date of Patent: Aug. 30, 2016

(54) INTELLIGENT MECHANICAL BALANCING APPARATUS FOR SLIDE SCREW TUNERS

(71) Applicant: Christos Tsironis, Kirkland (CA)

(72) Inventor: Christos Tsironis, Kirkland (CA)

(*) Notice: Subject to any disclaimer, the term of this patent is extended or adjusted under 35 U.S.C. 154(b) by 6 days.

(21) Appl. No.: 14/621,510

(22) Filed: Feb. 13, 2015

Related U.S. Application Data

(60) Provisional application No. 61/940,596, filed on Feb. 17, 2014.

(51) Int. Cl.
*H03H 7/38* (2006.01)
*H03J 1/06* (2006.01)
*H03H 7/40* (2006.01)

(52) U.S. Cl.
CPC .. *H03J 1/06* (2013.01); *H03H 7/40* (2013.01)

(58) Field of Classification Search
CPC .................................. H03H 7/38; H03H 7/40
USPC ......................................... 333/17.3, 33, 263
See application file for complete search history.

(56) References Cited

U.S. PATENT DOCUMENTS

| 5,276,411 A | 1/1994 | Woodin |
| 7,102,457 B1 | 9/2006 | Tsironis |
| 2009/0231054 A1* | 9/2009 | Boulerne ........... G01R 31/2601 333/17.3 |

OTHER PUBLICATIONS

Ultra-Tast Indicators, www.auto-met.com/fowler/ultratast/html, Feb. 17, 2002.

* cited by examiner

*Primary Examiner* — Stephen E Jones

(57) ABSTRACT

An intelligent, independent and universal mechanical balancing apparatus for automatic microwave multi-probe slide screw tuners allows stable on-wafer testing of sub-micrometric devices. Low loss rigid airlines (bend-lines) used to connect the multi-probe tuner with the chips, in order to improve the tuning range at the DUT reference plane, causes mechanical movements of the wafer probes attached to the rigid bend-lines, when the tuner mobile carriages move horizontally. Stabilizing the center of gravity (balancing) of the tuner by means of exactly controlled counter-weights, driven by the same firmware which controls the tuner motors, allows for synchronized compensation of the probe movement and safe on wafer load pull operation.

13 Claims, 15 Drawing Sheets

INTELLIGENT MECHANICAL BALANCING APPARATUS FOR SLIDE SCREW TUNERS

PRIORITY CLAIM

This application claims priority on provisional application 61/940,596 filed on Feb. 17, 2014 and titled "Intelligent Mechanical Balancing Apparatus for Slide Screw Tuner".

CROSS-REFERENCE TO RELATED ARTICLES

1. TSIRONIS, U.S. Pat. No. 7,102,457, Mechanically balanced microwave load pull tuner.
2. WOODIN, U.S. Pat. No. 5,276,411, High power solid state programmable load.
3. "ALPS-308, Active Load Pull System for PCN applications", Product Note 33, Focus Microwaves Inc., April 1996.
4. "Computer Controlled Microwave Tuner—CCMT", Product Note 41, Focus Microwaves Inc., January 1998.
5. Ultra-Tast Indicators, http://www.auto-met.com/fowler/ultratast.html.

BACKGROUND OF THE INVENTION

This invention relates to a method used to compensate the tilting of electro-mechanical microwave tuners employed in on-wafer measurement operations by adding a balancing counter-weight on the mechanism supporting the tuner. Modern design of high power microwave amplifiers and oscillators, used in various telecommunication systems, requires accurate knowledge of the active device's (microwave transistor's) characteristics. In such circuits, it is inadequate for the transistors, which operate in their highly non-linear regime, close to power saturation, to be described using non-linear numeric models only. Further on designing low noise amplifiers for communication systems requires exact knowledge of the noise parameters of microwave transistors to be used in the amplifiers; these can be obtained only by characterizing the microwave transistors by measuring their noise parameters.

A popular method for testing and characterizing such microwave components (transistors) in the small signal (low noise) and in the non-linear (high power) regions of operation is "source pull" and "load pull". Source and Load pull are measurement techniques employing microwave tuners and other microwave test equipment. The microwave tuners are used in order to manipulate the microwave impedance conditions under which the Device Under Test (DUT, or transistor) is tested (FIGS. 1 and 2).

A typical load pull measurement system (FIG. 1) includes a signal source, an input coupler leading to an input power meter, a source tuner, a test fixture housing the DUT, a load tuner and an output power meter. The tuners and the overall test system are controlled by a control computer, which is connected to the tuners by control cables. Through digital commands from the computer the tuner's motors position the tuner's probes appropriately and create impedances, which allow characterizing the DUT (see reference 1).

Electro-mechanical slide screw tuners, compared to electronic tuners (see reference 2) or active load pull tuners (see reference 3), have a number of advantages like long-term stability, higher handling of microwave power, easier operation and lower cost. Such tuners (FIGS. 2 to 6) use adjustable mechanical obstacles (probes or slugs) inside the transmission media of the tuners; the transmission media are made using a slotted coaxial line or parallel plate airline (slabline), in order to reflect part of the power coming out of the DUT (device under test) and create this way adjustable microwave impedances presented to the DUT in order to perform the corresponding tests (see reference 4).

Electro-mechanical tuners comprise a solid housing (box), FIG. 3, a low loss transmission media for microwave energy (slotted transmission line or slabline) with an input or test port attached to a rigid bend-line, a moving carriage holding the microwave probe and electrical motors ensuring the horizontal and vertical movement of the carriage and the probe. The tuner is placed on a tuner positioner, which has bearings or gliders allowing a 3 axis geometrical movement (X-Y-Z). The carriage holding the probe comprises housing, a precision vertical gear and a vertical motor; this makes such carriages massive items with a typical weight on around 1 kg.

Control of the reflection factor phase is through horizontal movement of the carriage (see reference 4). Moving the massive carriage horizontally shifts the center of gravity of the whole assembly "tuner-bend-line-3 axis positioner" in such a way that the wafer probes touching the wafer chips may be crushed (FIGS. 2, 3). In order to cover a 360 degree circle of the reflection factor on the Smith Chart the free horizontal travel of the mobile carriage must be one half of a wavelength at the frequency of operation; for example at 1 GHz the free travel must be 15 cm, at 2 GHz 7.5 cm etc. A full noise or load pull characterization of transistors on wafer in this and lower frequency range requires the tuner mobile carriage to move horizontally over distances of this order of magnitude. It is during this operation that the wafer probe crushing problems appear, that this invention aims to solve.

The tilting problem of the tuner assembly is especially disturbing when using rigid bend-lines (FIGS. 2 to 4). Alternative configurations, like using semi rigid or flexible RF cables between the wafer probes and the tuners, would reduce this problem, but the cables represent an inferior solution from the RF point of view, because they require extra adapters and the core of the cables is filled with some dielectric material, like Teflon, which introduces higher insertion loss at microwave frequencies, thus reducing the effective tuning range of the tuners, i.e. the maximum reflection factor, that can be presented to the DUT.

The low loss bend-airlines create a rigid mechanical link between the tuners and the wafer micro-probes (FIG. 2). For on-wafer measurements using solid bend-lines a microwave tuner needs to be mounted on a 3-axis positioner (FIGS. 2 to 4) which manipulates the position of the probe together with the position of the tuner. Any mechanical movement inside the tuners like tilting of the whole assembly by the horizontal movement of the tuner carriages is translated on to the probes and creates a vertical probe movement of several dozens of micrometers. Considering that the contact pads on a wafer device under test (chip) have typical dimensions of 100 μm to 200 μm, it is obvious that even a small mechanical movement of the probes may easily damage the DUT contact pads and/or the wafer probes themselves. In order to avoid the vertical movement of the tuners and by consequence of the wafer probes the tuners must be 'balanced' whatever the actual position of the carriage is inside the tuner housing.

This is even more critical in the case of multi-carriage tuners. Such tuners can have 2, 3 or even more movable carriages, in which case the moving mass to contemplate can exceed 3 kg. The additional problem here is that the carriages do not move simultaneously and by the same amount in horizontal direction; instead each carriage moves independently of the others by a different amount and in the same or the opposite direction each time impedance is created. This creates the need of an intelligent independent compensation control allowing compensation of the overall total movement of the carriages and the resulting total shift of the center of gravity of the tuner system.

It is the purpose of this invention to solve the tilting problem using an intelligent automated mechanism of simultaneous tilting compensation (balancing) of the totality of the carriage movement.

BRIEF SUMMARY OF THE INVENTION

The problem referred to in 'BACKGROUND OF THE INVENTION', is solved by introducing, outside of the tuner housing (box), an independently controllable mobile counter-weight, horizontally moving equally, synchronous and opposite to the algebraic sum of the movements of all carriages inside the tuner, in order to maintain the center of gravity of the assembly "tuner positioner, tuner and probes" constant and compensate for any vertical movement (tilting) of the wafer probes, which are in contact with the wafer chips.

BRIEF DESCRIPTION OF THE DRAWINGS

The invention and its mode of operation will be better understood from the following detailed description when read when read with the appended drawings in which.

DETAILED DESCRIPTION OF THE INVENTION

The concept of a mechanically controlled balancing counter-weight is well established in moving mechanical constructions, like cranes etc., which are not allowed to tilt and, eventually, fall. The balancing counter-weight has to move synchronically and in opposite direction with the load, in order to keep the center of gravity of the whole structure constant. This concept has been used, in a purely mechanical version, in impedance tuners in prior art (see reference 1).

Figure 1:
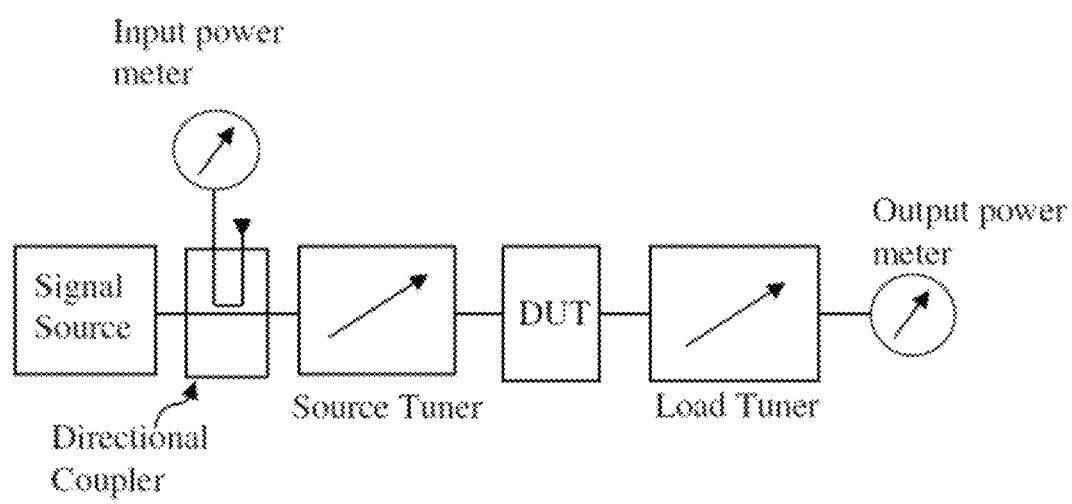
FIG. 1 (Prior Art) depicts a block diagram of a load pull measurement setup, in which electro-mechanical impedance tuners are used to manipulate the source and load impedances presented to the DUT.
Figure 2:
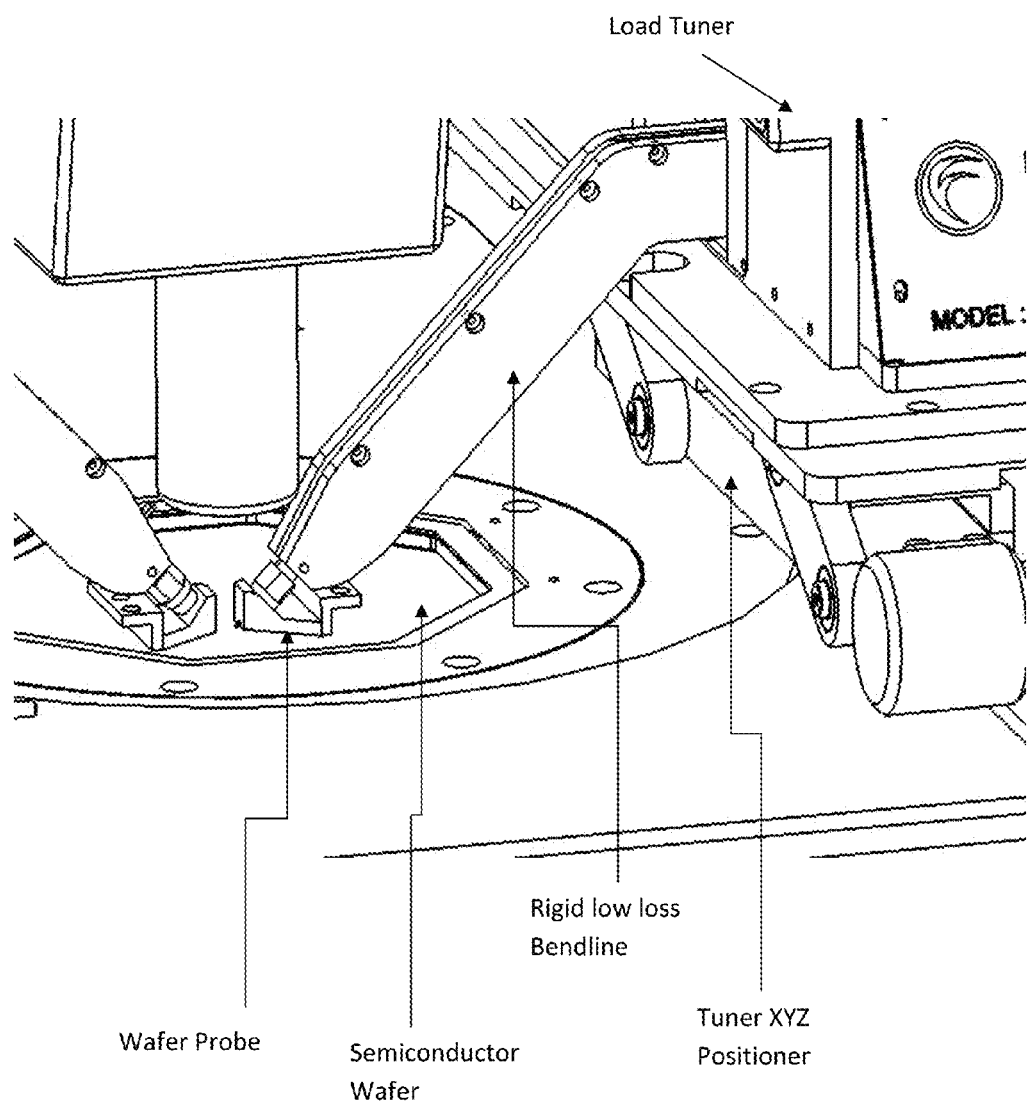
FIG. 2 (Prior Art) depicts a photograph of a actual setup employing electro-mechanical impedance tuner on XYZ positioner with a rigid bendline and wafer probe operating on a semiconductor wafer.
Figure 3:
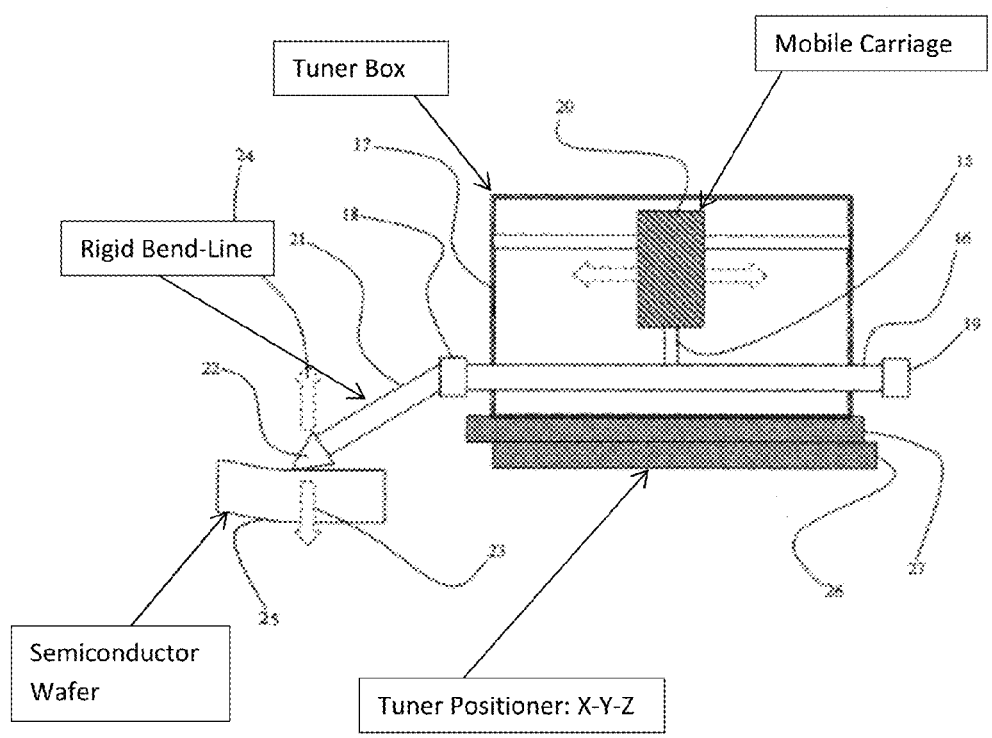
FIG. 3 (Prior Art) depicts a schematic cross section of the moving mechanism of an automatic microwave tuner, assembled and mounted for on-wafer (25) testing.
Figure 4:
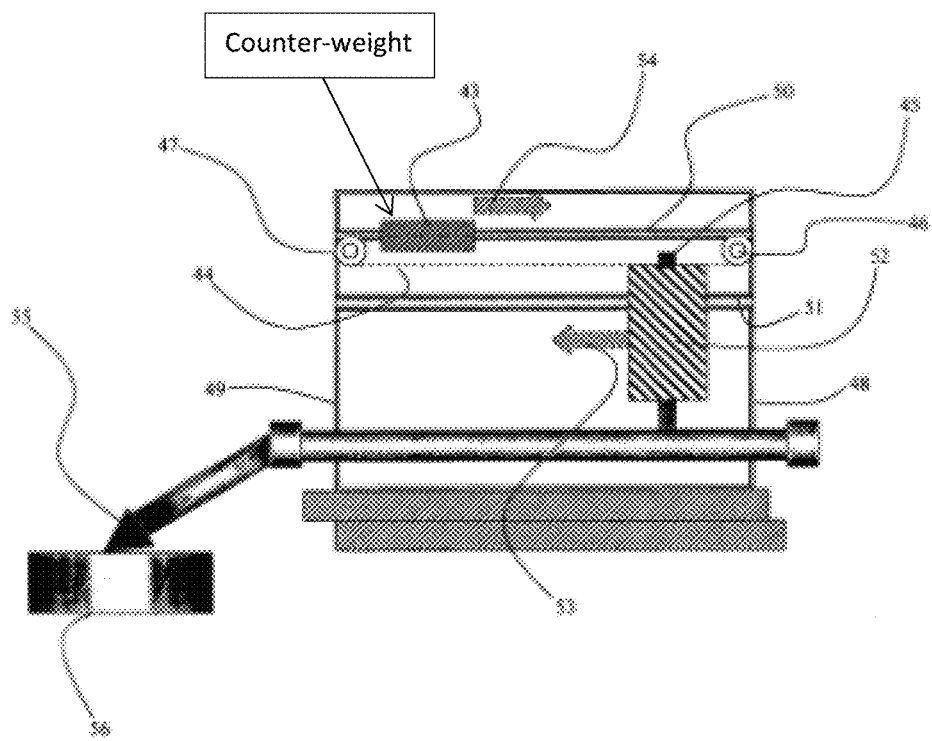
FIG. 4 (Prior art) depicts an automatic microwave tuner balanced for vertical tilting, using a mobile counter-weight (43), placed inside the tuner enclosure and synchronized mechanically (44, 46, 47) with the movement of the carriage (52).
Figure 5:
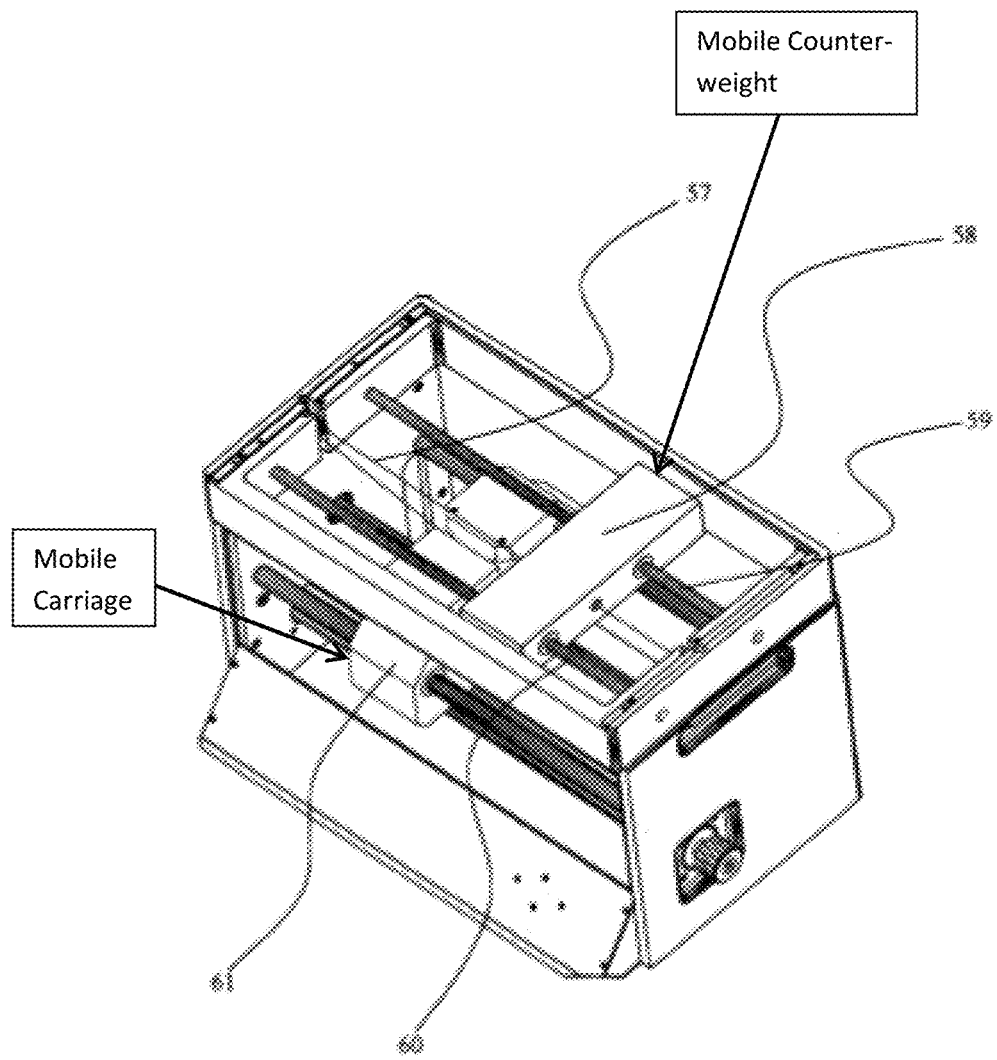
FIG. 5 (Prior art) depicts an automatic single carriage microwave tuner balanced for vertical tilting, using a mobile counter-weight (58), placed on the top of the tuner body.
Figure 6:
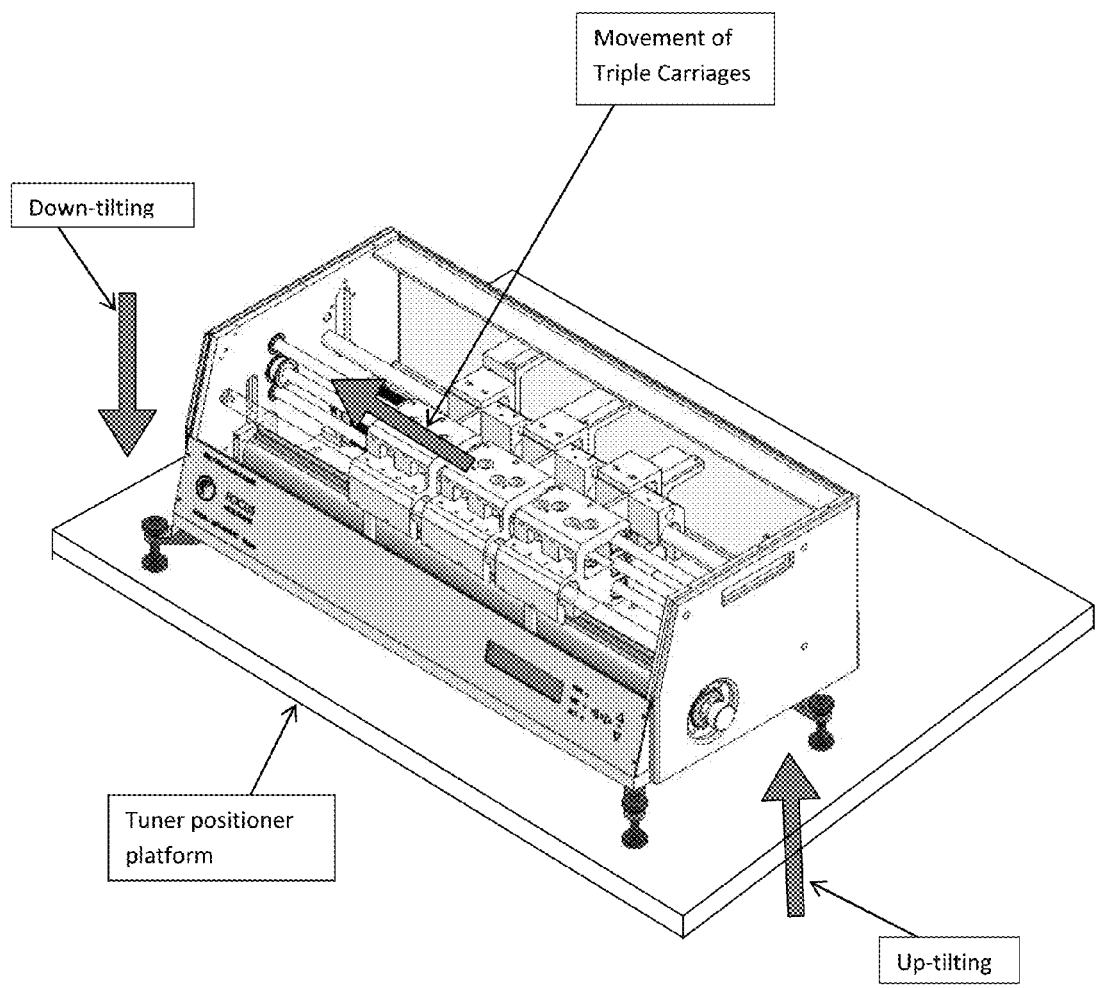
FIG. 6 (Prior art) depicts a perspective view of the (uncompensated) tilting mechanism of a three-carriage tuner mounted on the positioner platform caused by the horizontal movement of the tuner carriages.

In the case of electro-mechanical microwave tuners, as shown in FIG. 3, the cause of un-balance and 'tilting' is the horizontally movable massive carriage, which holds and controls the vertical movement of the RF probe and moves along the airline from one end of the tuner to the other. The mechanically controlled counter-weight has been used in single carriage tuners (FIGS. 4, 5) to compensate for the tilting (see reference 1). However a counter-weight it has not been used in multi-carriage tuners (FIG. 6), since it is impossible to expand on the idea of reference 1 by adding additional mechanically synchronous movements for the additional independently moving carriages, without extreme complication of the structure (for each carriage an extra carriage with separate sliders and the exact mass of the carriage must be introduced).

Impedance synthesis (tuning) using remotely controlled (automatic) electro-mechanical tuners occurs by positioning a reflective probe inside the slot of a slotted transmission line (slabline) at a certain distance from the center conductor, creating a controlled capacitance, and at certain distance from the test port (and by extension from the DUT) creating a controlled phase of the reflected wave (reflection factor). This creates a reflection factor GAMMA which has an amplitude |GAMMA| and a phase <GAMMA or GAMMA=|GAMMA|*exp(j*<GAMMA). This corresponds to an impedance Z=Zo*(1+GAMMA)/(1−GAMMA). GAMMA varies from −1 to +1 and from −j to +j and Z varies from 0 to +INF (=infinite).

The reflective probes are held by vertical axis that moves them up and down and is incorporated in horizontally movable massive carriages (61). When the carriages move (53) the center of gravity of the tuner changes. This causes the tilting that may destroy the microscopic wafer probes (55). But tuning occurs in two steps: in a first step the control computer calculates, in memory, using calibration data, the required horizontal and vertical probe positions to create the target impedance. So, before anything moves the controller "knows" where the probes stand and where they must go. Vertical probe movement is here irrelevant, because it does not change the center of gravity of the tuner. But horizontal movement does matter, because it does modify the center of gravity. Therefore the controller must control both the horizontal carriage motors and the counter-weight motor to move opposite to keep the center of gravity constant at all times. In the case of a single carriage this can be done by simple mechanical means (see reference 1 and FIGS. 4 and 5). But when two or more carriages move (FIG. 6) then (a) the counter weight must be close to the sum of the totality of the carriages and it must move opposite and by a proportionally corrected amount, corresponding to the "net" carriage movement. It is practical to use the same motor speed in all motors. Therefore the counter-weight mass shall be similar to the totality of the mass of the carriages.

The controller, knowing the future movements of every carriage, can now anticipate the total algebraic movement of all moving carriages from the present to the next position (any carriage can move left or right independently on each-other), and can move the counter-weight in a way to compensate for this movement of the center of gravity, not of each carriage individually, even if this could also be done. The balancing apparatus is agnostic as per the number of carriages. The only thing that matters is the movement correction factor MCF (equal to the ratio of the mass of one carriage to the mass of the counter-weight) of each carriage and the associated carriage movement. This can be done "one carriage at a time", or simultaneously for all carriages. What is important is that the center of gravity and the counter-weight move at the same speed opposite and simultaneously. This is guaranteed if all motors rotate at the same speed, corresponding at the same horizontal number of "steps/second" for the carriages, the counter-weight and the center of gravity. Any difference in "step size" between the carriages and the counter-weight is taken into account in determining the individual MCF for each carriage.

Figure 7:
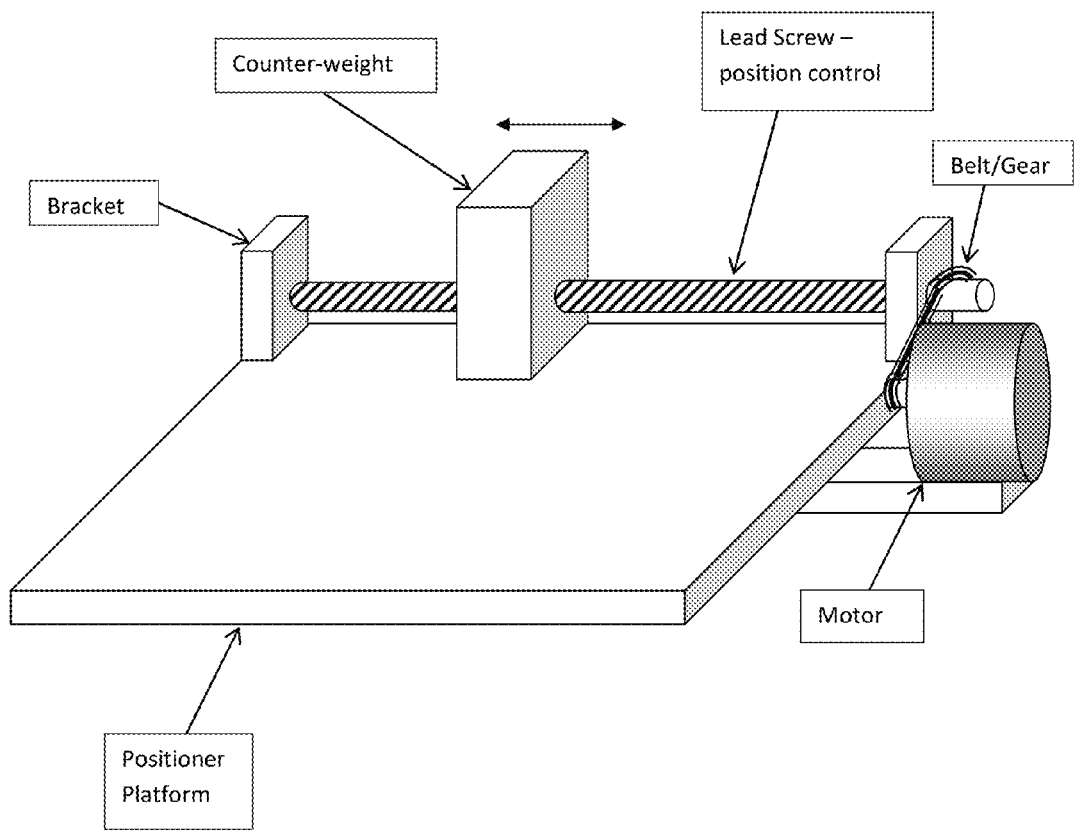
FIG. 7 depicts a perspective view of the positioner platform with the counter-weight balancing mechanism associated with an independent drive, gear and motor.

A perspective view of the proposed solution is shown in FIG. 7; the controlled counter-weight is not mounted inside or on top of the tuner, as in prior art (see reference 1); it is mounted on the platen (platform) of the tuner positioner. The single counter-weight has independent gear and control using an axial screw attached to an electrical motor through a belt or other gear. The screw is held parallel to the platform by two brackets and is attached to the counter-weight. The motor is best controlled by the tuner itself (FIG. 8) or by the common "tuner"-"counter-weight" controller. This controller will compute the exact compensation movement needed for the counter-weight to execute, to compensate for any carriage move.

Figure 8:
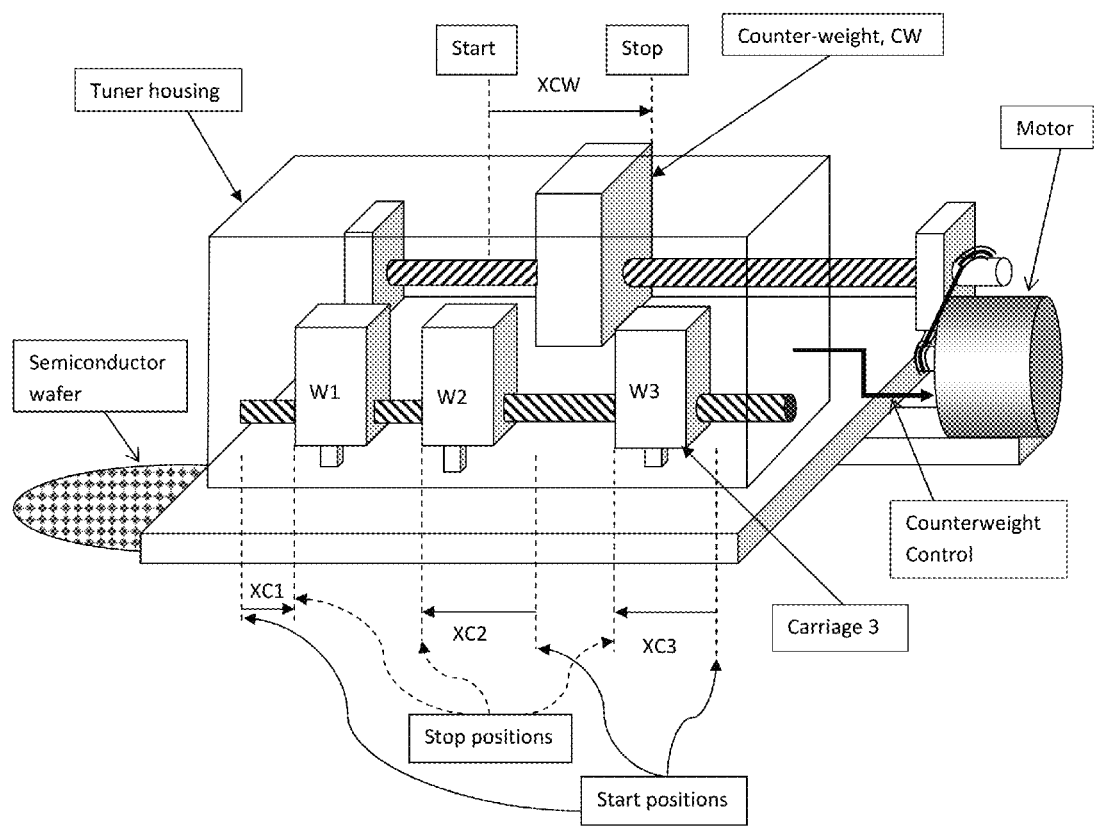
FIG. 8 depicts the concept and perspective view of a three-carriage tuner mounted on the tuner positioner and the associated relative carriage movements to be compensated by the (independent) movement of the counter-weight: carriage 1 moves to the right, while carriages 2 and 3 move to the left, relative to their previous positions.
Figure 9:
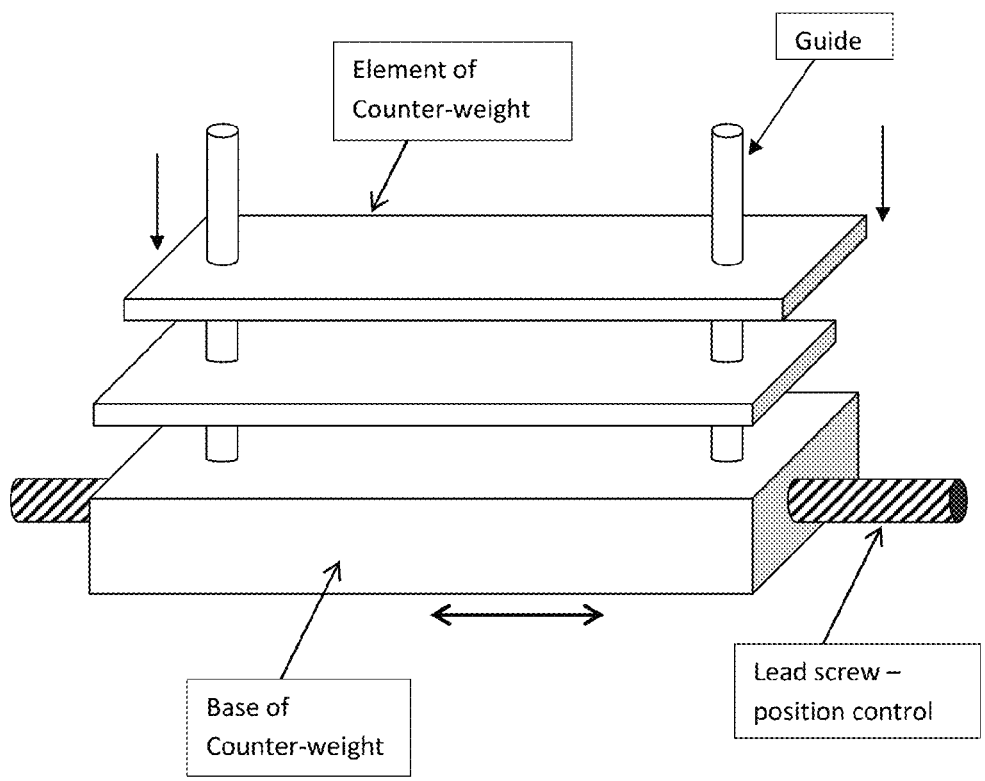
FIG. 9 depicts a stackable counter-weight allowing matching approximately the counter-weight to the total carriage weight of single and multi-carriage tuners.
Figure 10:
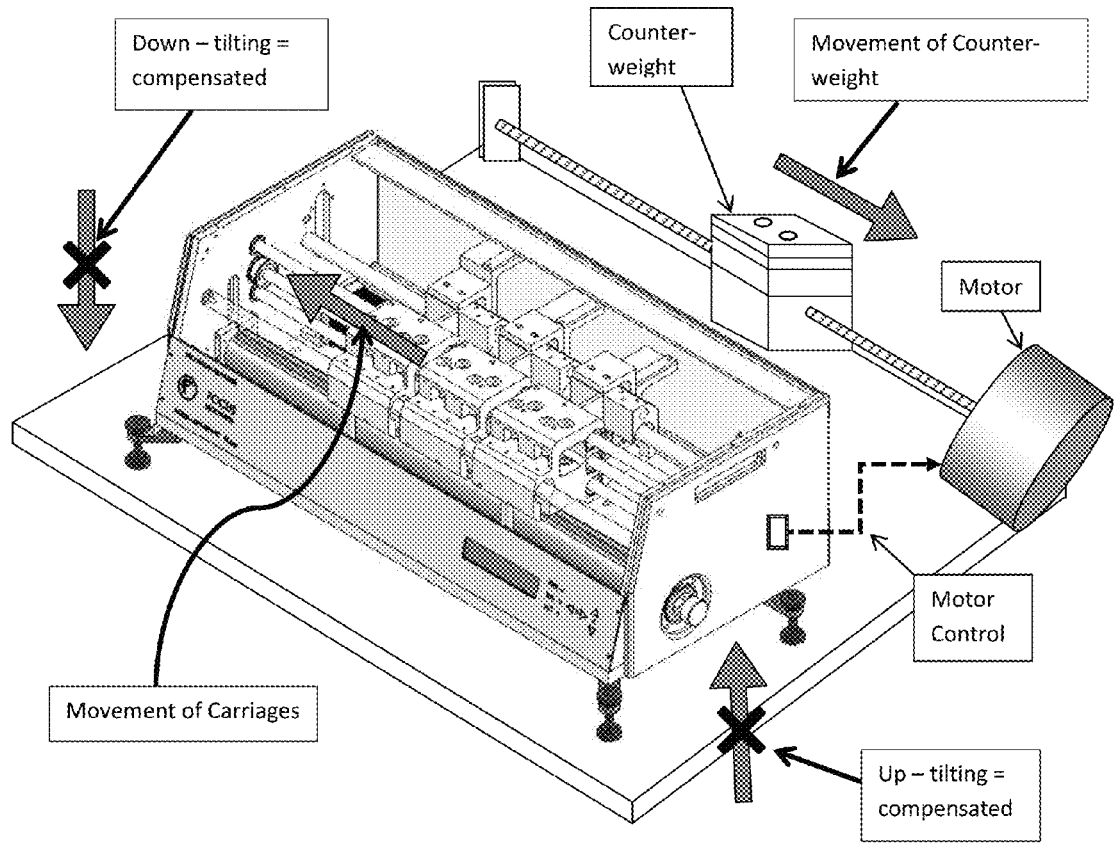
FIG. 10 depicts a perspective view of the mounted and operating counter-weight to cancel vertical tilting of a three-carriage tuner.

FIG. 8 shows all relevant quantities and movement coordinates and definitions. Each carriage movement to be compensated by a counter-weight movement is relative to the previous position of the specific carriage itself. All movements are relative. It is practical, but not mandatory, for the counter-weight to have a mass CW approximately equal to the sum of the mass of the three carriages (W1+W2+W3≈CW); The difference between the weight of the carriages and the counter-weight can be calibrated out and corrected numerically by the controller, as will be discussed forthwith. It is also important to consider that the proposed solution does not require knowledge of the exact mass of each carriage before the operation as prior art (see reference 1). The balancing apparatus and correction algorithm disclosed here allows for balancing of already installed tuner systems, because it is external and does not require an intervention on the tuners themselves.

To reach compensation the counter-weight must move, every time one or more carriages moves horizontally, by a corrected amount XCW=Σ MCFi*XCi, in the opposite direction; hereby MCFi is the Movement Correction Factor accounting for any difference in mass between the mass of each carriage (Wi) and the mass of the counter-weight CW. XCi is the individual movement of each carriage; each carriage is indexed by "i".

Figure 12:
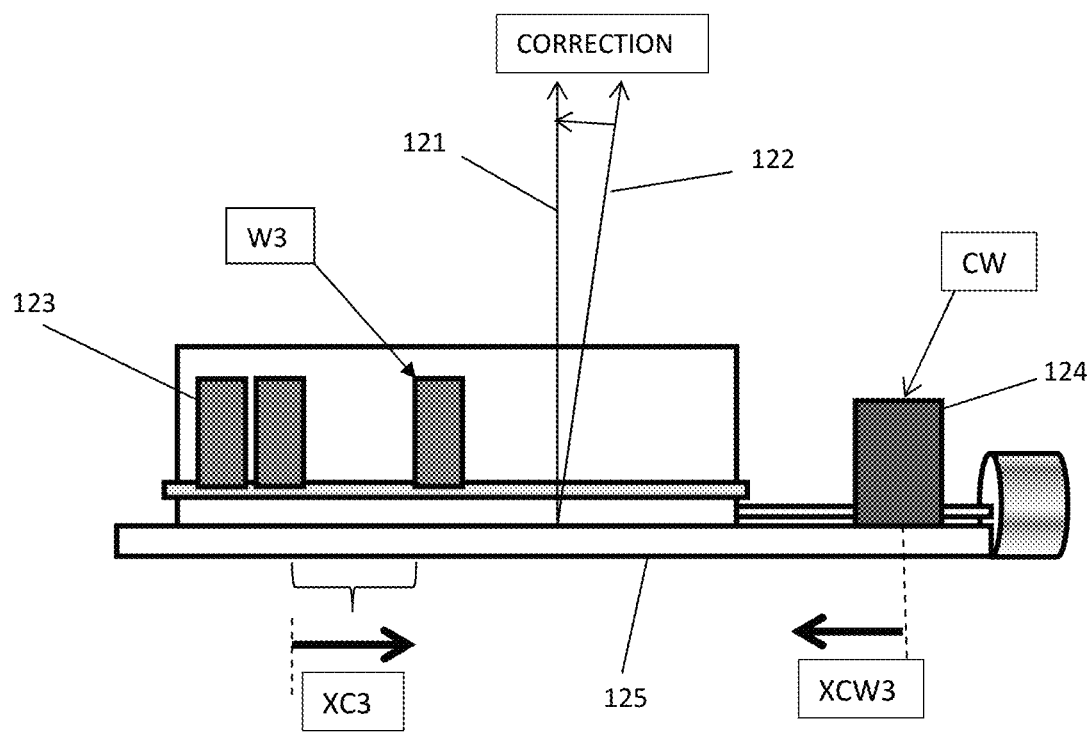
FIG. 12 depicts the concept of determining the carriage and counter-weight Movement Correction Factor MCF; shown is the first step: moving and compensating carriage 3. The procedure is repeated with carriages 2 and 1.
Figure 15:
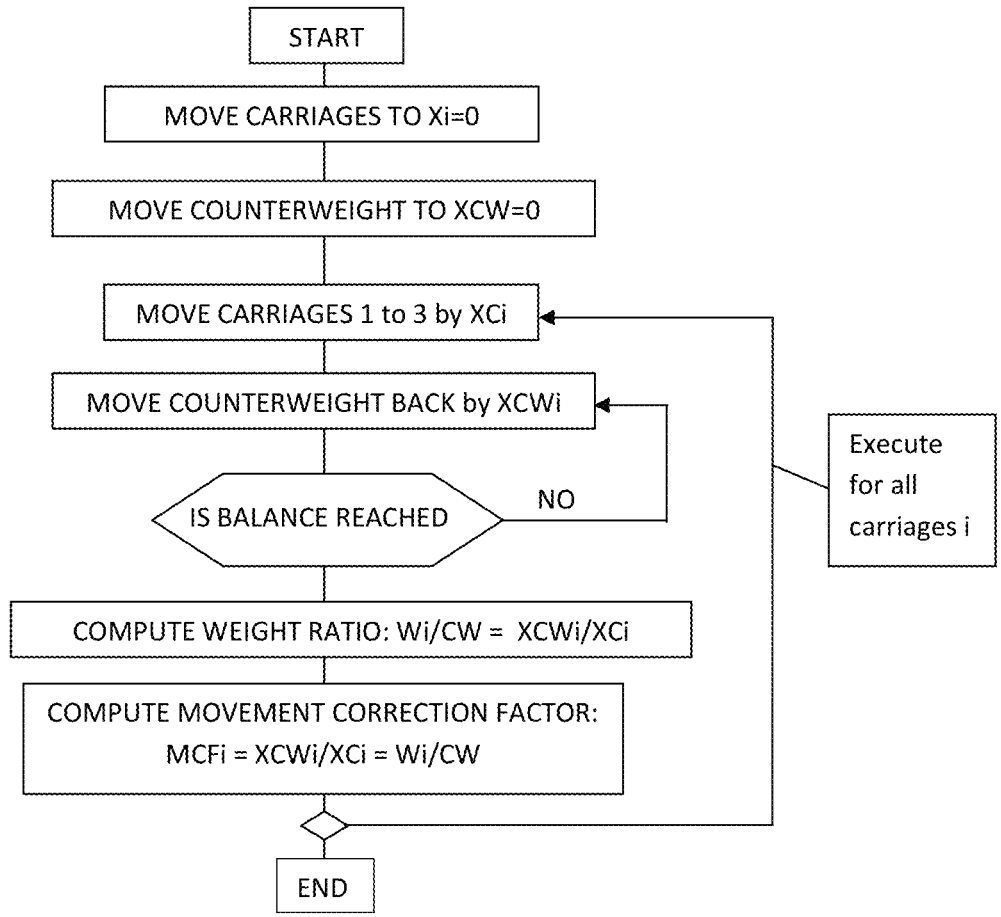
FIG. 15 depicts the flowchart of the procedure used to determine the movement correction factor MCFi for each carriage indexed by "i".

The correction factor MCFi is a general method, valid for any number of mobile carriages in a slide screw tuner and, as an example of a tuner with three carriages, can be determined as follows (FIGS. 12 and 15):

a) Move the three carriages to the far left position (XCi=0);
b) move the counter-weight to the far right position (XCW=0);
c) mark the slope of the platform (ideally horizontal, but not necessary), this can be done using a simple indicator (see reference 5) applied at one end of the platform;
d) move the third carriage by XC3, leaving carriages 1 and 2 at XC1=XC2=0;
e) move the counter-weight back by XCW3 to bring the slope of the platform back to the original position (c);
f) calculate MCF3=XCW3/XC3=W3/CW (W3 is the mass of carriage 3 and CW is mass of the counter-weight);
g) move the second carriage by X2C (≤XC3), leaving carriage 1 at X1=0;
h) move the counter-weight further back by XCW2 to bring the slope of the platform back to the original position (c);
i) calculate MCF2=XCW2/XC2=W2/CW (W2 is the mass of carriage 2);
j) move the first carriage by XC1 (≤XC2);
k) move the counter-weight further back by XCW1 to bring the slope of the platform back to the original position (c);
l) calculate MCF1=XCW1/XC1=W1/CW (W1 is the mass of carriage 1).

The method is, in fact, valid for any initial position of the carriages and the counter-weight. The proposed values of XCi=0 and XCW=0 allow for the highest sensitivity of the system and easiness of application.

Figure 11:
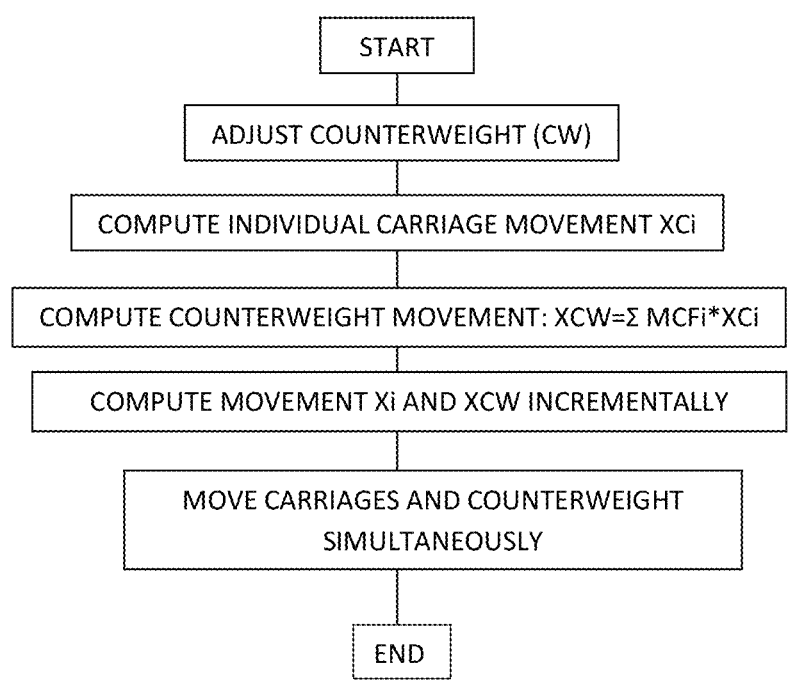
FIG. 11 depicts the flowchart of the movement control algorithm of the basic tuner carriage and the counter-weight.

Following this procedure all movements of the counter-weight must be calculated using the intended carriage movements, before any carriage moves, as follows:

$$XCW = \Sigma MCFi * XCi \qquad \text{(equation 1)};$$

this is shown in the flowchart of FIG. 11.

Figure 13:
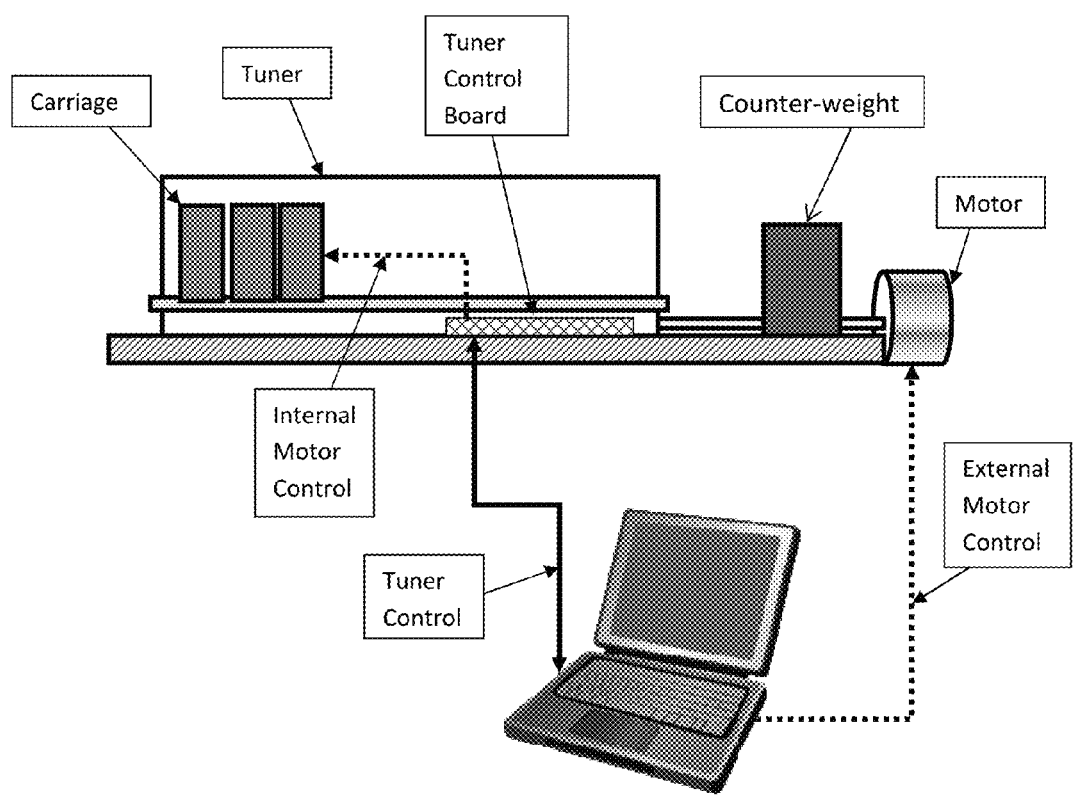
FIG. 13 depicts a setup allowing control of tuner carriages, probes and counter-weight independently by external controller.

Control of the operation can be internal or external. If the control is external (FIG. 13) the system controller (external PC) calculates XCW based on equation 1 and communicates with the motor control board of the tuner, which then controls the carriage and probe positions; simultaneously the external controller controls the counter-weight motor in such a way as for the counter-weight to move opposite and by the same amount as the center of gravity of the tuner and positioner assembly; that is by calculating at each instance the incremental horizontal movement of the three carriages (Σ Xi) and moving the counterweight by the corrected amount (equation 1) in the opposite direction. This can be done either if all carriages move at the same time, in which case (XCi≠0) for all "i", or if each carriage moves individually, in which case XCj=0 and XCi≠0, with i≠j. All these cases are satisfied by equation 1.

Figure 14:
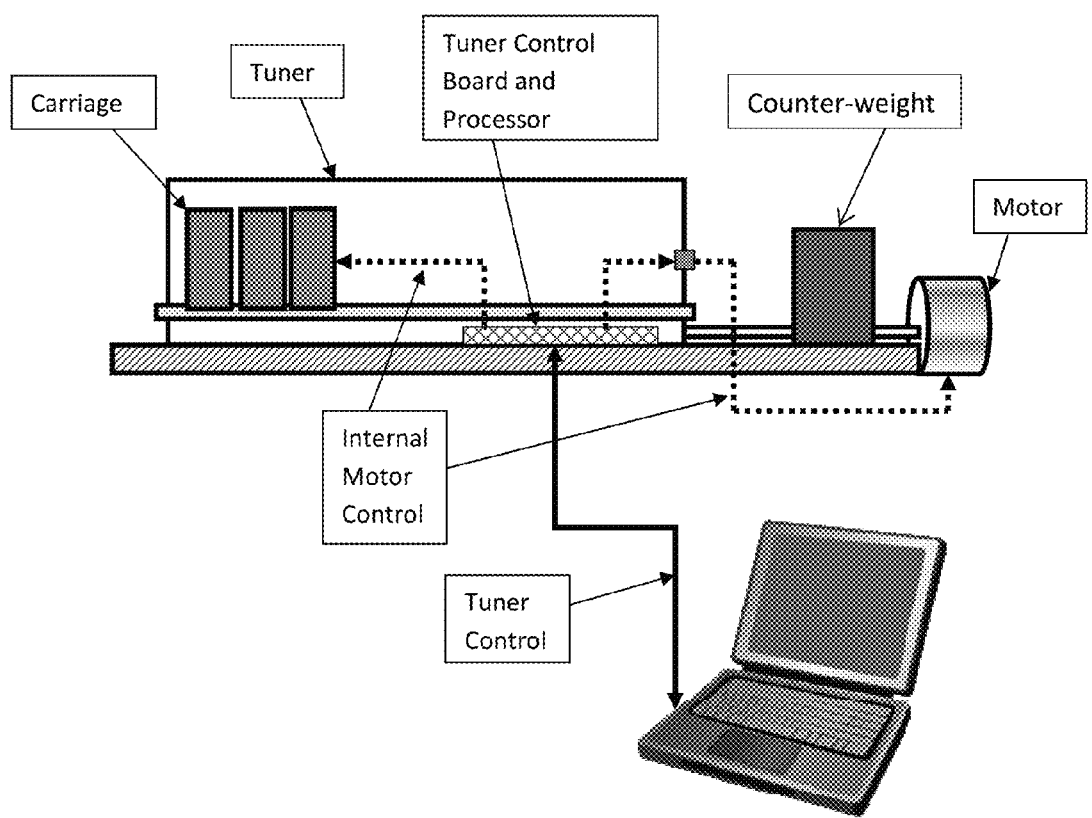
FIG. 14 depicts a setup allowing control of tuner carriages, probes and counter-weight by internal tuner control processor and board.

If the control is internal, then the external controller communicates with the tuner control board only and the tuner must be equipped with an electronic control board comprising a numerical processor, which controls both the carriages and probes and the counter-weight motor through an additional connection, and which board is able to perform the above calculations (equation 1) and instruct all motors to move synchronously, at every instance, each carriage and the counter-weight accordingly (FIG. 14).

The invention has been disclosed based on a number of preferred embodiments. Obvious alternative configurations and embodiments of the disclosed embodiments of the compensation mechanism shall not impede on the reach of the invention. Obviously modified or re-arranged algorithms for determining the movement correction factor MCF and counterweight control mechanism shall not impede on the general scope of the concept.

What I claim is:

1. A tilting-compensation (balancing) apparatus for test setups using electro-mechanical slide screw impedance tuners, said tuners comprising one or more horizontally movable carriages, and motor controller being in operational communication with an external system controller, said compensation apparatus comprising a platform and remotely controlled counter-weight and counter-weight controller;

whereby the platform carries the tuner and the counter-weight, and whereby the counter-weight is movable parallel to the movement of the tuner carriages, and whereby the counter-weight controller comprises driving mechanism, electrical motor and gear, said counter-weight having a mass similar to the mass of all tuner carriages together.

2. An apparatus as in claim 1, whereby said system controller comprises a numerical processor, which is capable of anticipating the total movement of the tuner carriages and, applying a movement correction factor (MCF), determining the necessary movement of the counter-weight needed to compensate for the shift of the center of gravity, caused by the movement of the carriages.

3. An apparatus as in claim 2, whereby said system controller is incorporated in the tuner.

4. A counter-weight for a balancing mechanism as in claim 1, comprising a base attached to the remote driving mechanism and vertical guides allowing stacking additional weight modules to obtain approximately the weight of all mobile carriages in the tuner.

5. An apparatus as in claim 1, comprising a motor controller in operational communication with the system controller, whereby the system controller
a) calculates the compensating movement of the counter-weight as a function of the movement of the tuner carriages, using a movement correction factor (MCF), and b) controls the movement of the tuner carriages and the counter-weight simultaneously.

6. An apparatus as in claim 5, whereby the driving mechanism of the counter-weight comprises a lead mechanism attached to the counter-weight and is driven by stepper motor using appropriate gear, said motor being controlled by the motor controller.

7. An apparatus as in claim 6, whereby the lead mechanism is attached to the counter-weight using a belt.

8. An apparatus as in claim 6, whereby the lead mechanism is attached to the counter-weight using a lead screw.

9. An apparatus as in claim 6, whereby the lead mechanism is attached to the counter-weight using rack and pinion.

10. A method for determining the necessary movement of the counter-weight in claim 1 in three steps:
    a) displace the tuner carriages one by one and compensate the platform tilting by associated counter-displacement of the counter-weight;
    b) using the data in step a) calculate the movement correction factor for each individual carriage;
    c) calculate the total counter-weight correction movement.

11. A method for determining the movement correction factor (MCFi) for each individual of N≥1 tuner carriages as in claim 10, in following steps:
    a) move all N carriages to the far left position, next to each-other (XCi=0, initialized)), whereby "i" is the index of the carriage, 1≤i≤N;
    b) move the counter-weight to the far right position (XCW=0);
    c) mark the angle of the slope of the platform;
    d) set i=N;
    e) move the carriage i by a distance XCi, avoiding conflict with any previously moved carriage, leaving all not yet moved carriages initialized;
    f) move the counter-weight to the left by a distance XCWi to bring the slope of the platform back to the original angle marked in step c);
    g) calculate MCFi=XCWi/XCi and save;
    h) if i=1 go to step j), else
    i) reduce i by one and go to step e);
    j) terminate.

12. A method for determining the total correction movement of the counter-weight (XCW), for N tuner carriages i (1≤i≤N) as the sum of all movement correction factors MFCi multiplied by the associated carriage movements, as follows:

$$XCW = \Sigma MCFi * XCi,$$

for i=1 to N;

whereby XCi is the movement of carriage "i" between two consecutive positions, and MCFi the associated carriage movement correction factor as calculated in claim 11.

13. A method for instantaneous correction of the platform tilting, created by the movement of the tuner carriages, comprising an opposite counter-weight movement as determined in claim 12.

* * * * *